(12) United States Patent
Yu et al.

(10) Patent No.: US 12,354,926 B2
(45) Date of Patent: Jul. 8, 2025

(54) PACKAGE AND METHOD FOR MANUFACTURING THE SAME

(71) Applicant: Taiwan Semiconductor Manufacturing Co., Ltd., Hsinchu (TW)

(72) Inventors: Chen-Hua Yu, Hsinchu (TW); Tin-Hao Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 169 days.

(21) Appl. No.: 17/077,815

(22) Filed: Oct. 22, 2020

(65) Prior Publication Data
US 2021/0305123 A1  Sep. 30, 2021

Related U.S. Application Data

(60) Provisional application No. 63/001,190, filed on Mar. 27, 2020.

(51) Int. Cl.
*H01L 23/40* (2006.01)
*H01L 23/367* (2006.01)
(Continued)

(52) U.S. Cl.
CPC ........ *H01L 23/3675* (2013.01); *H01L 23/373* (2013.01); *H01L 23/4006* (2013.01);
(Continued)

(58) Field of Classification Search
CPC ....... H01L 2023/4043; H01L 2023/405; H01L 23/4006; H01L 23/4012; H01L 23/49827;
(Continued)

(56) References Cited

U.S. PATENT DOCUMENTS 6,285,076 B1 * 9/2001 Ando ................. H01L 24/72
257/688
10,586,785 B2   3/2020 Gao et al.
(Continued)

FOREIGN PATENT DOCUMENTS

CN       101887888 A    11/2010
CN       107527901 A    12/2017
(Continued)

OTHER PUBLICATIONS

Joel Hruska, "Cerebras Systems Unveils 1.2 Trillion Transistor Wafer-Scale Processor for AI", Aug. 20, 2019. https://www.extremetech.com/extreme/296906-cerebras-systems-unveils-1-2-trillion-transistor-wafer-scale-processor-for-ai (Year: 2019).*

*Primary Examiner* — Yu Chen
(74) *Attorney, Agent, or Firm* — Slater Matsil, LLP

(57) ABSTRACT

A package includes a die having a first side and a second side opposite to each other. The package also includes an encapsulating material surrounding the die. The package further includes a redistribution layer (RDL) structure disposed over the first side of the die and the encapsulating material. The package yet includes a heat dissipating feature disposed over the second side of the die and the encapsulating material. In addition, the package includes a first screw assembly penetrating through the die, the RDL structure and the heat dissipating feature.

20 Claims, 18 Drawing Sheets

(51) Int. Cl.
  *H01L 23/373* (2006.01)
  *H01L 23/433* (2006.01)
  *H01L 23/495* (2006.01)
  *H01L 23/538* (2006.01)
  *H01L 25/065* (2023.01)
  *H01L 23/00* (2006.01)
  *H01L 23/31* (2006.01)

(52) U.S. Cl.
  CPC .... *H01L 23/4334* (2013.01); *H01L 23/49503* (2013.01); *H01L 23/5389* (2013.01); *H01L 25/0655* (2013.01); *H01L 23/3128* (2013.01); *H01L 2023/4043* (2013.01); *H01L 2023/4087* (2013.01); *H01L 24/81* (2013.01)

(58) Field of Classification Search
  CPC .......... H01L 23/5384; H01L 23/49822; H01L 23/5383; H01L 23/3107; H01L 23/3121; H01L 23/3128; H01L 23/32; H01L 24/72; H01L 2224/72; H01L 2023/4018–4087; H01L 23/498–49894; H01L 23/538–5389; H01L 23/481; H01L 25/042; H01L 25/0655; H01L 25/072; H01L 25/0753; H01L 2225/06541; H01L 2225/06544; H01L 21/76898; H01L 21/486; H05K 1/0203–021; H05K 2201/10409

See application file for complete search history.

(56) References Cited

U.S. PATENT DOCUMENTS

| | | |
|---|---|---|
| 11,004,803 B2 | 5/2021 | Yu et al. |
| 2004/0142508 A1 | 7/2004 | Brodsky et al. |
| 2009/0039498 A1* | 2/2009 | Bayerer .................. H05K 3/44 |
| | | 257/E23.173 |
| 2009/0129036 A1 | 5/2009 | Fujii et al. |
| 2010/0284155 A1* | 11/2010 | Stolze .................... H01L 24/37 |
| | | 361/728 |
| 2014/0239488 A1 | 8/2014 | Kobayashi et al. |
| 2016/0233261 A1 | 4/2016 | Hsu et al. |
| 2016/0204084 A1 | 7/2016 | Lin |
| 2017/0365581 A1* | 12/2017 | Yu ........................ H01L 25/0655 |
| 2018/0138101 A1* | 5/2018 | Yu .......................... H01L 23/481 |
| 2018/0145011 A1 | 5/2018 | Lin |
| 2018/0219001 A1* | 8/2018 | Gao ........................ H01L 24/83 |
| 2019/0067052 A1* | 2/2019 | Fricker .................. H01L 24/00 |
| 2020/0006252 A1* | 1/2020 | Yu ............................. H01L 25/50 |
| 2020/0051890 A1* | 2/2020 | Fricker .................... C09K 5/14 |
| 2020/0105641 A1* | 4/2020 | Lai ........................ H01L 21/568 |
| 2020/0118877 A1* | 4/2020 | Fricker .................. H05K 1/181 |
| 2020/0203270 A1* | 6/2020 | Liu ......................... H01L 23/528 |
| 2020/0286858 A1* | 9/2020 | Fricker ............... H01L 23/5385 |
| 2021/0202312 A1* | 7/2021 | Yu ........................ H01L 23/522 |

FOREIGN PATENT DOCUMENTS

| | | |
|---|---|---|
| CN | 110676223 A | 1/2020 |
| DE | 102019103993 A1 | 1/2020 |
| DE | 102020106547 A1 | 3/2021 |
| JP | H08167669 A | 6/1996 |
| JP | 2009130048 A | 6/2009 |
| KR | 20010062263 A | 7/2001 |
| KR | 20140105371 A | 9/2014 |
| TW | 201644018 A | 12/2016 |

* cited by examiner

PACKAGE AND METHOD FOR MANUFACTURING THE SAME

PRIORITY CLAIM AND CROSS-REFERENCE

This application claims priority to U.S. Provisional Patent Application No. 63/001,190, filed Mar. 27, 2020, entitled "Super Large Fan Out Package."

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, wafer level integration and packaging has emerged as an effective alternative to further reduce the physical size of a semiconductor device. A plurality of functional dies (e.g., active circuits such as logic, memory, processor circuits and the like) of a certain type may be formed on a substrate. In wafer level packages such as reconstituted wafers, functional dies of different types are singulated from their respective substrates, placed together on a carrier substrate, and packaged together as a single functional device. Such wafer level integration and packaging processes utilize sophisticated techniques, and improvements are desired. The high level of integration of advanced packaging technologies enables production of semiconductor devices with enhanced functionalities and small footprints, which is advantageous for small form factor devices such as mobile phones, tablets and digital music players. Another advantage is the shortened length of the conductive paths connecting the interoperating parts within the semiconductor device. This improves the electrical performance of the semiconductor device, since shorter routing of interconnections between circuits yields faster signal propagation and reduced noise and cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
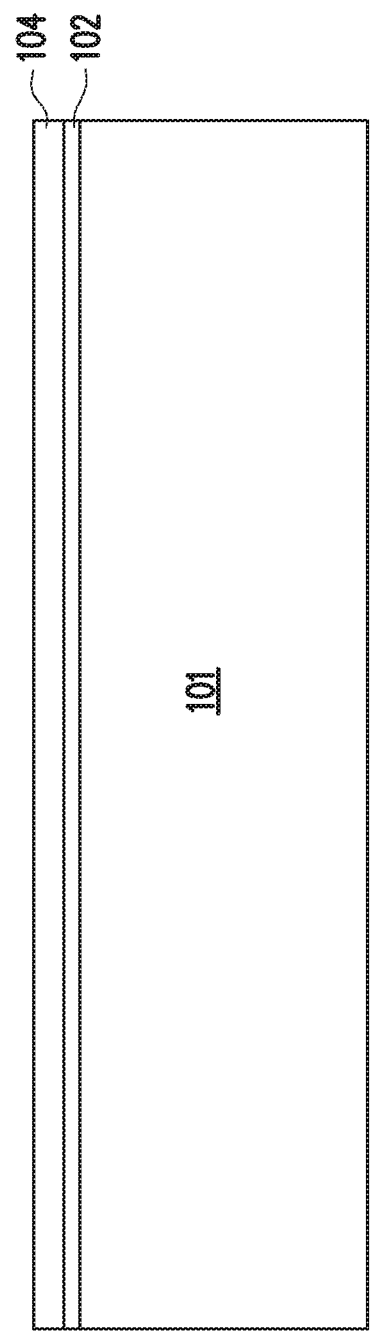
FIGS. 1A through 1H are schematic cross-sectional views showing various stages in a manufacturing method of a package according to some exemplary embodiments of the present disclosure.
Figure 1B:
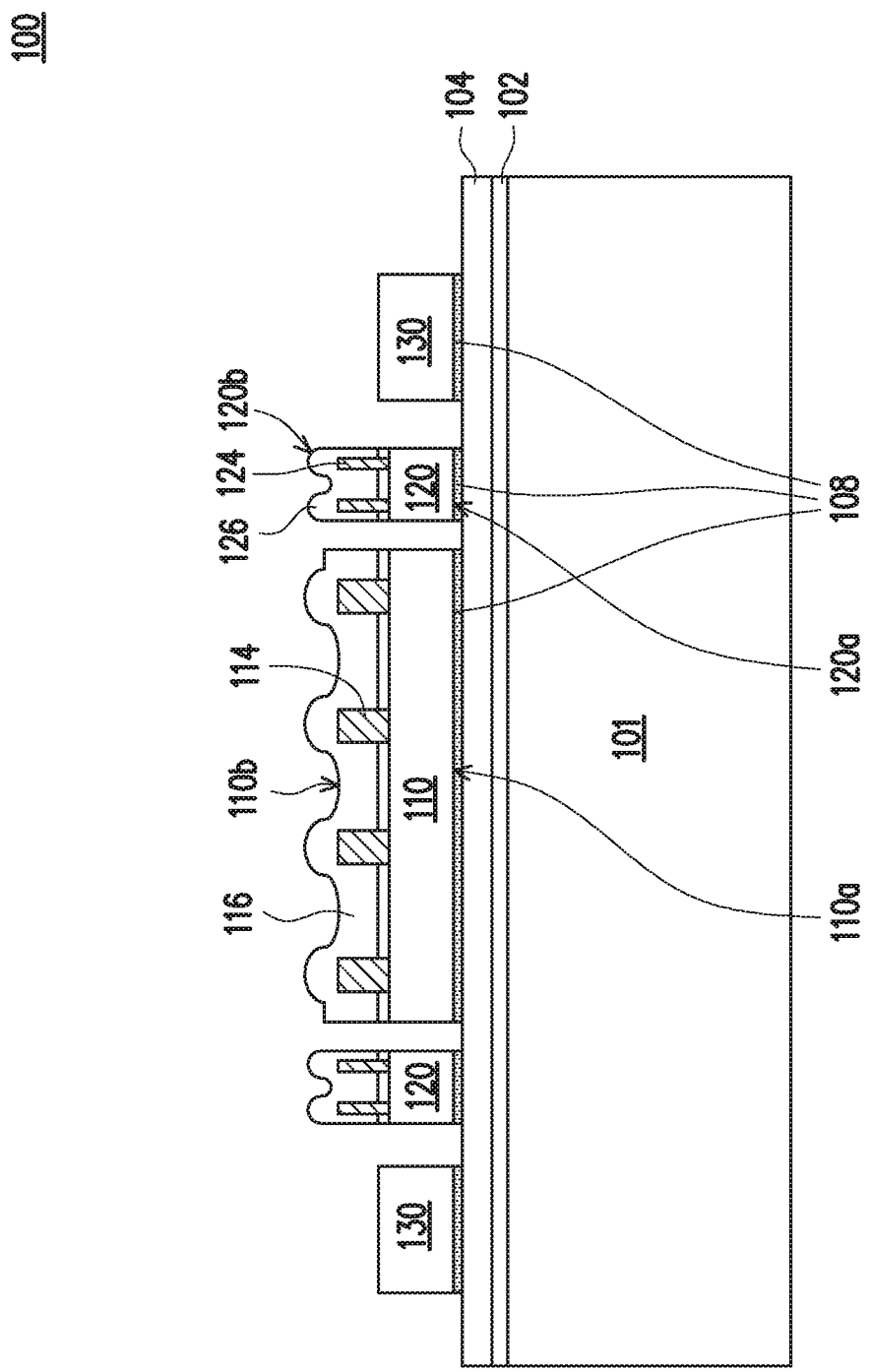
Figure 1C:
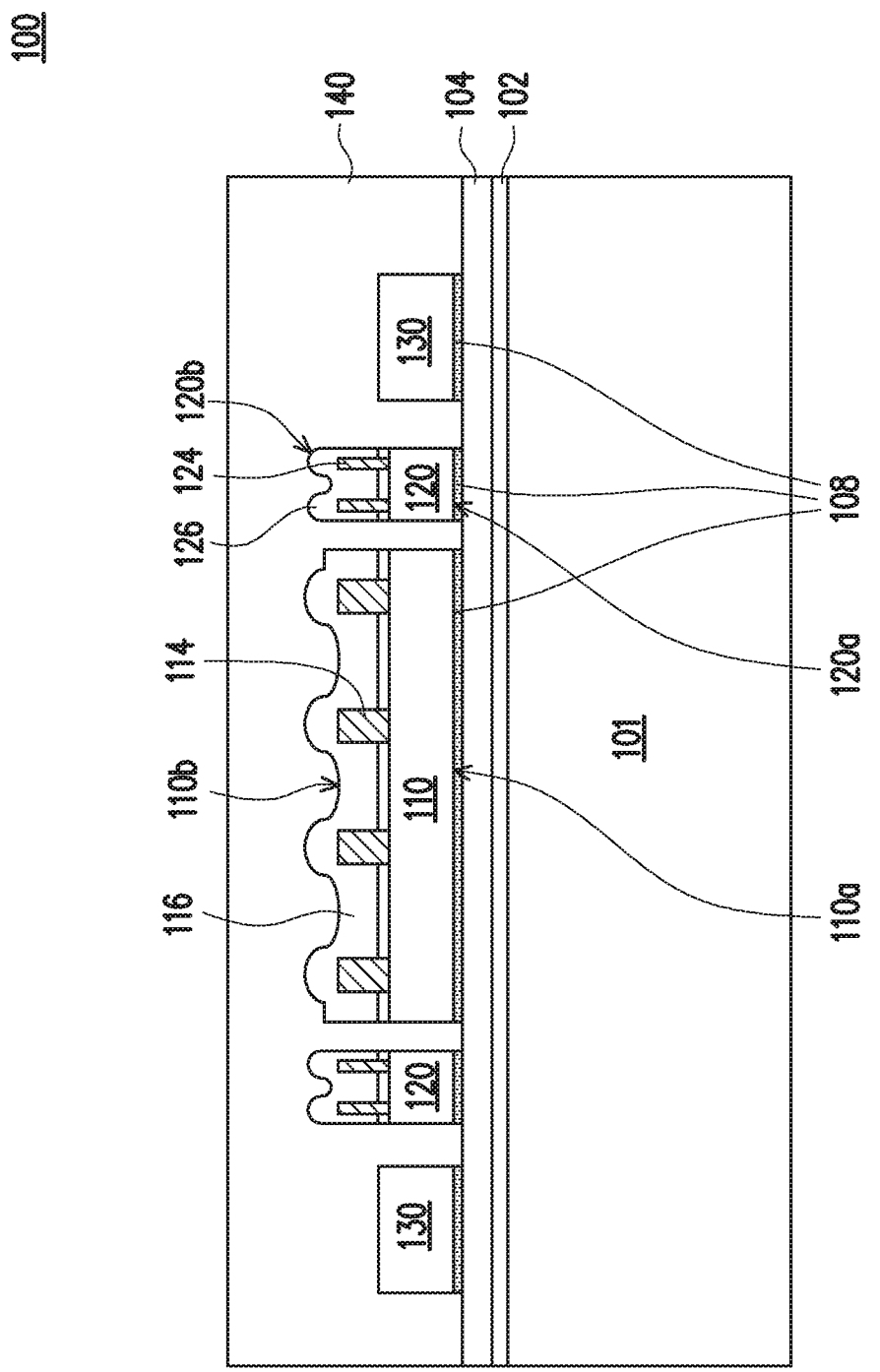
Figure 1D:
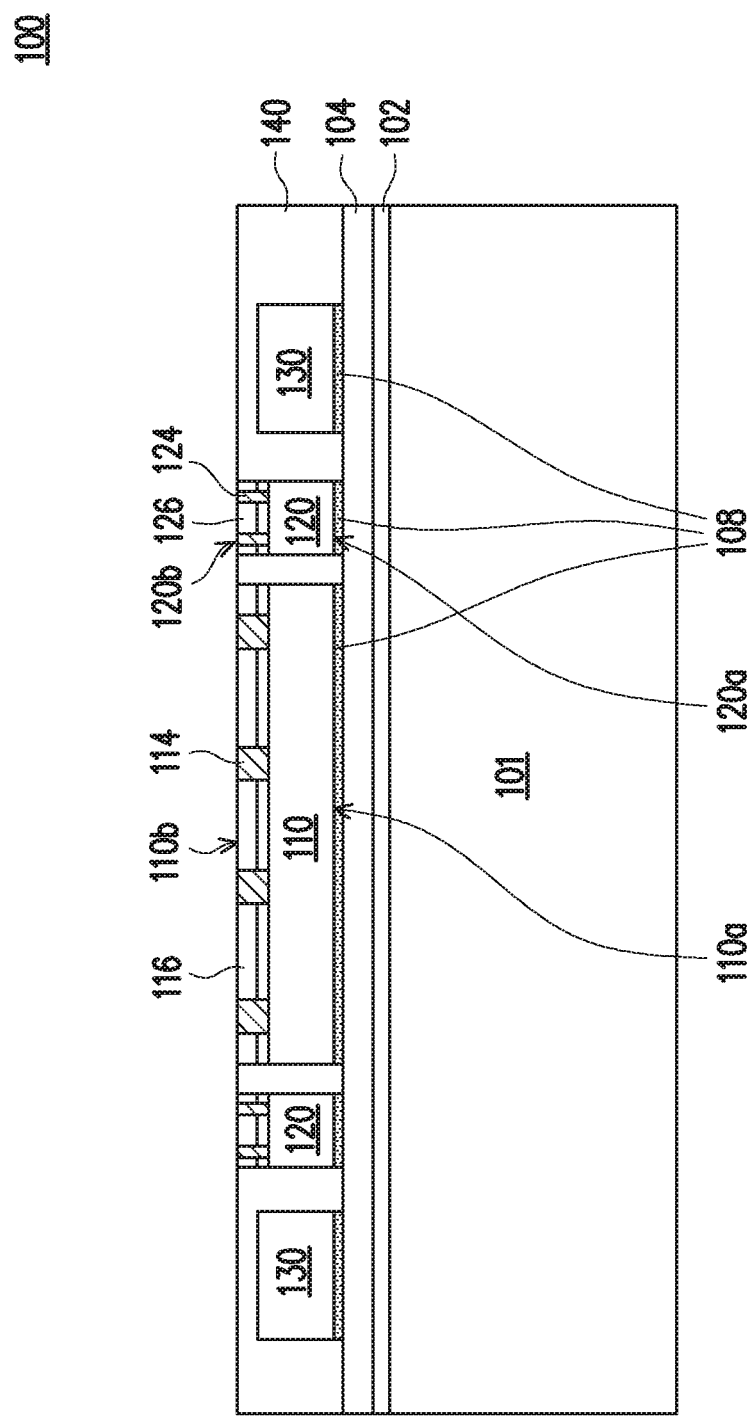
Figure 1E:
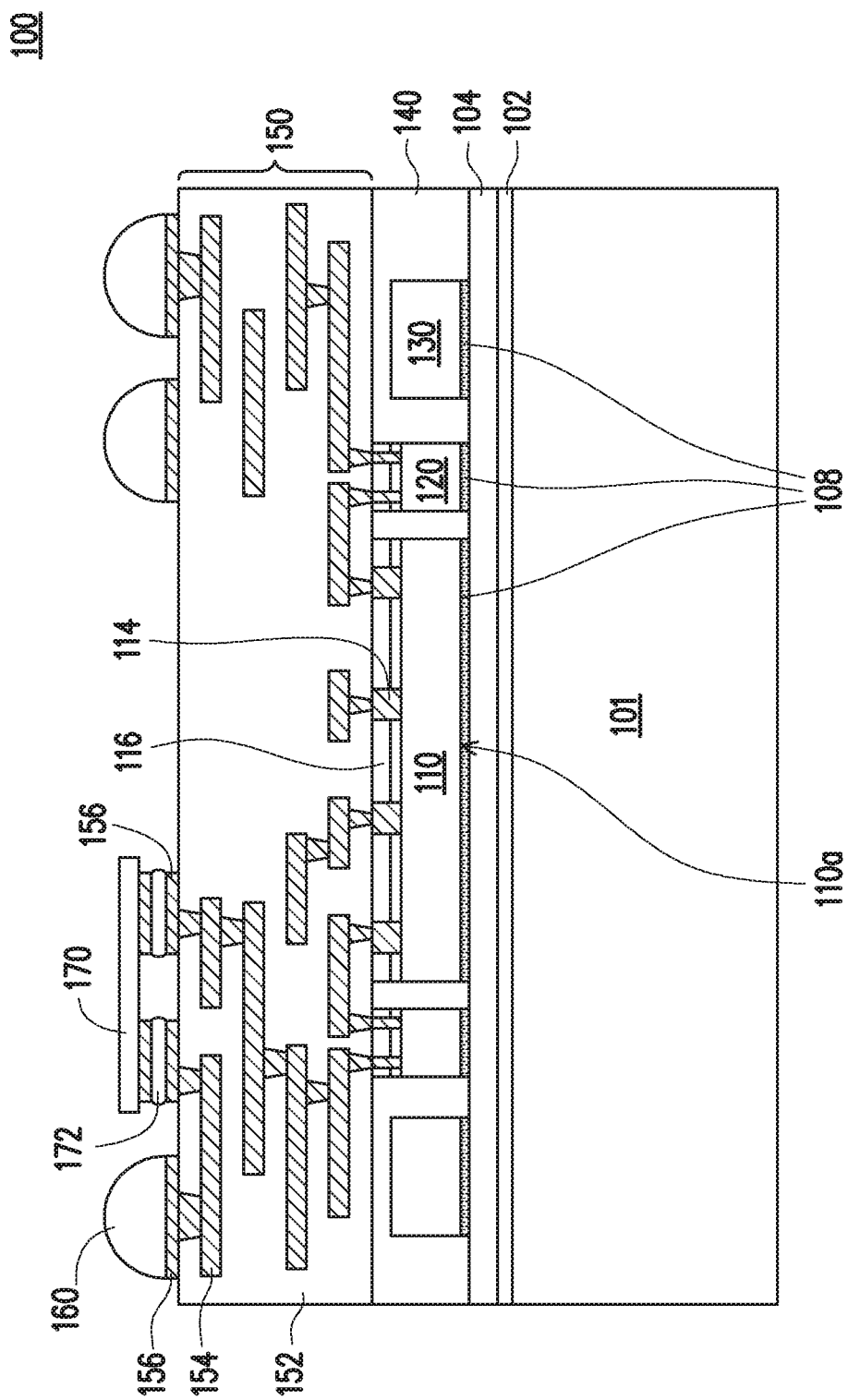
Figure 1F:
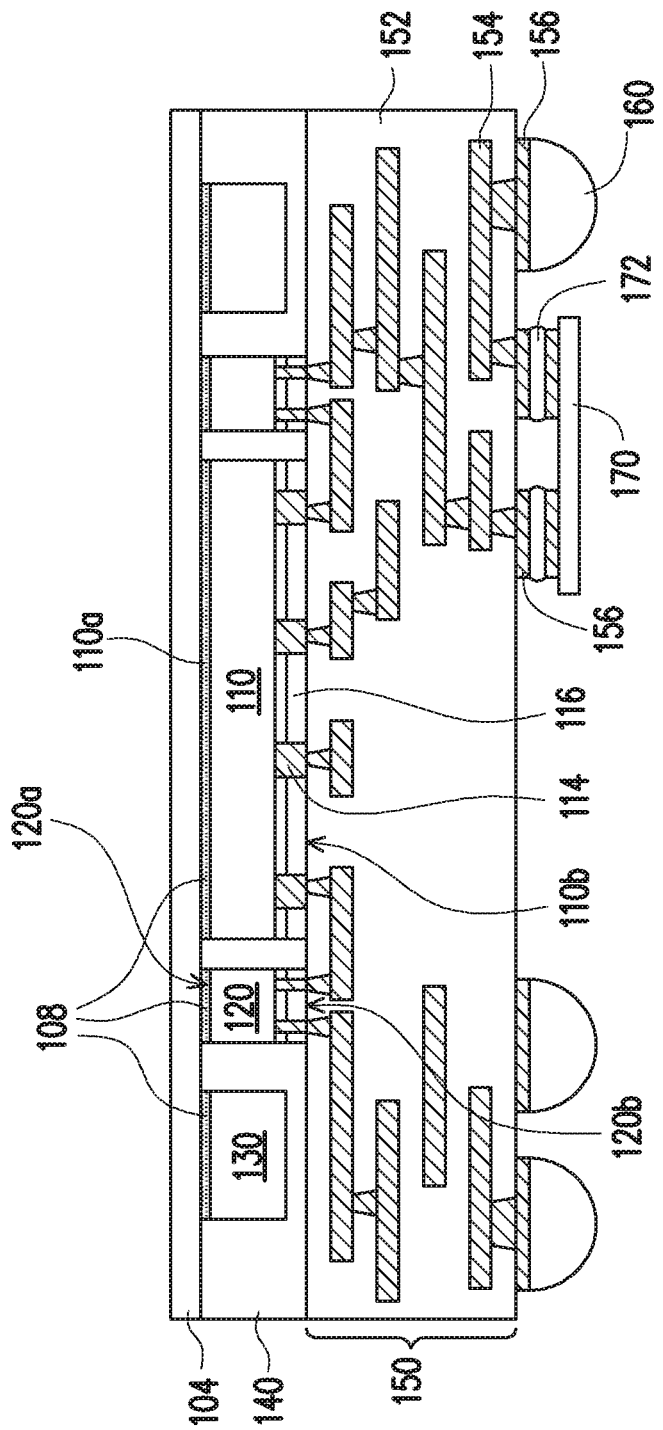
Figure 1G:
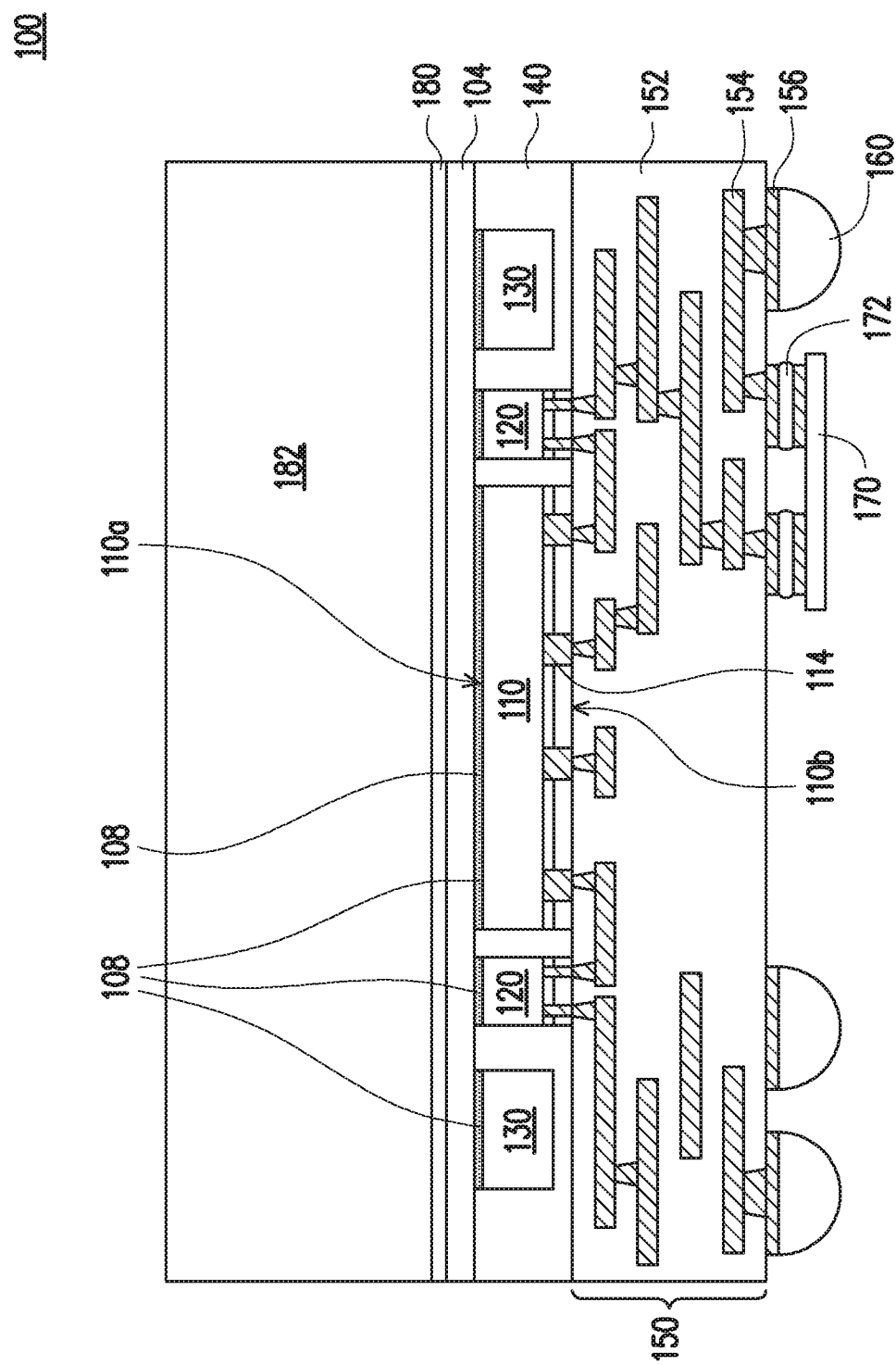
Figure 1H:
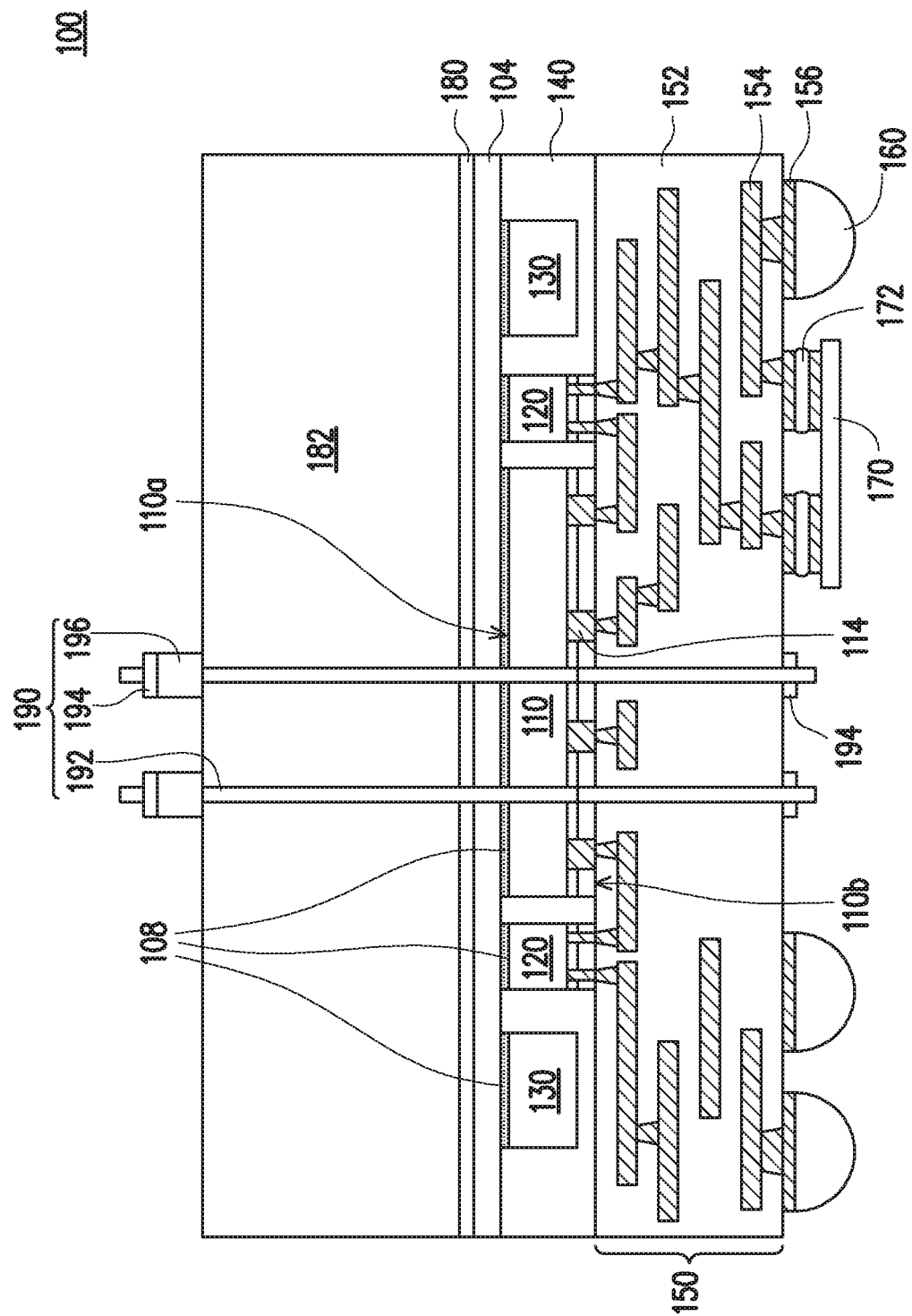

FIGS. 1A through 1H are cross-sectional views illustrating steps of fabricating a package 100 shown in FIG. 1H in accordance with some embodiments. Referring first to FIG. 1A, to fabricate the semiconductor package in FIG. 1A, a carrier 101 is provided. The carrier 101 may include glass, silicon oxide, aluminum oxide, or a semiconductor wafer, as examples. The carrier 101 may also include other materials. In an example, the carrier 101 is a glass panel or a glass wafer. The carrier 101 may be circular, square, or rectangular in a top view, as examples. Alternatively, carrier 101 may include other shapes, such as a square or rectangular with rounded corners. In some embodiments, the carrier 101 has a length or a diameter greater than around 250 mm. In other embodiments, the carrier has a length or a diameter greater than around 500 mm.

The carrier 101 has a release layer 102 optionally formed over the carrier substrate 101 that may allow easier removal of the carrier substrate 101. As explained in greater detail below, various layers and devices will be placed over the carrier 101, after which the carrier 101 may be removed. The release layer 102 aids in the removal of the carrier 101, reducing damage to the structures formed over the carrier 101. The release layer 102 may be formed of a polymer-based material. In some embodiments, the release layer 102 is an epoxy-based thermal release material, which loses its adhesive property when heated, such as a Light-to-Heat-Conversion (LTHC) release coating. In other embodiments, the release layer 102 may be an ultra-violet (UV) glue, which loses its adhesive property when exposed to UV light. The release layer 102 may be dispensed as a liquid and cured. In other embodiments, the release layer 102 may be a laminate film laminated onto the carrier 101. Other release layers may be utilized.

In some embodiments, an insulating material 104 is disposed over the release layer 102. Alternatively, the insulating material 104 is disposed over the carrier 101 when the release layer 102 is not formed. The insulating material 104 includes a passivation layer for the package. The insulating material 104 includes a glue/polymer base buffer layer in some embodiments, for example. The insulating material 104 includes a solder resist (SR), polyimide (PI), polybenzoxazole (PBO), benzocyclobutene (BCB), or multiple layers or combinations thereof in some embodiments, as examples. The insulating material 104 includes a thickness of about 1 μm to about 20 μm, for example. Alternatively, the insulating material 104 may include other materials and dimensions. The insulating material 104 is formed using spin coating, lamination, chemical vapor deposition (CVD), or other methods, for example.

FIG. 1B illustrates attaching a first functional die 110 to the insulating material 104. Also, a second functional die 120 and/or a dummy die 130 are optionally attached to the insulating material 104 in accordance with some embodiments. The first functional die 110, the second functional die 120, and the dummy die 130 may adhere to the insulating material 104 by an adhesive layer 108, such as a die-attach film (DAF). A thickness of the adhesive layer 108 may be in a range from about 10 μm to about 30 μm. The first functional die 110, second functional die 120, and dummy die 130 may be coupled to the insulating material 104 manually or using an automated machine such as a pick-and-place machine.

Figure 7B:
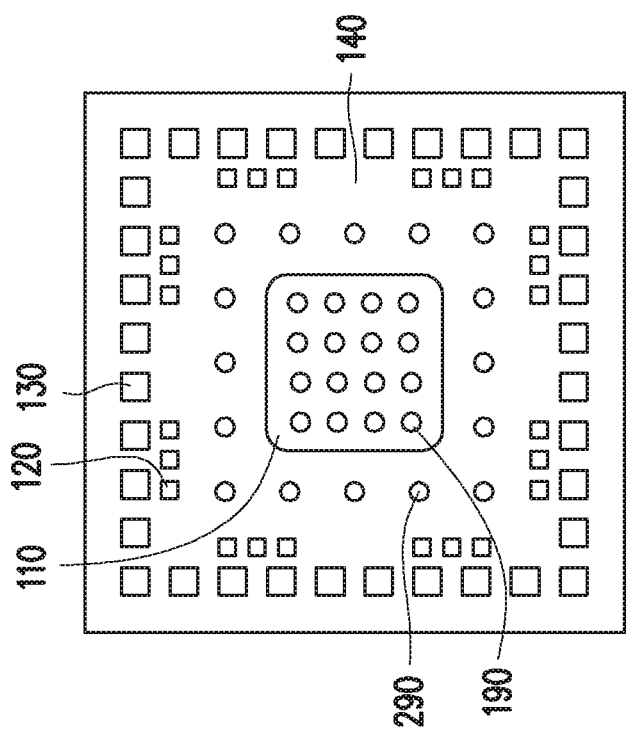
FIGS. 7A through 7E are schematic planar views showing various packages according to some exemplary embodiments of the present disclosure.
Figure 7A:
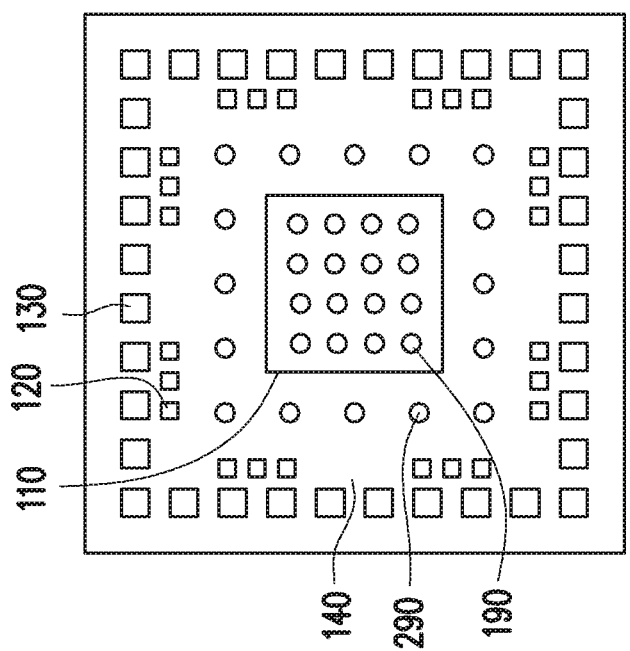
Figure 7D:
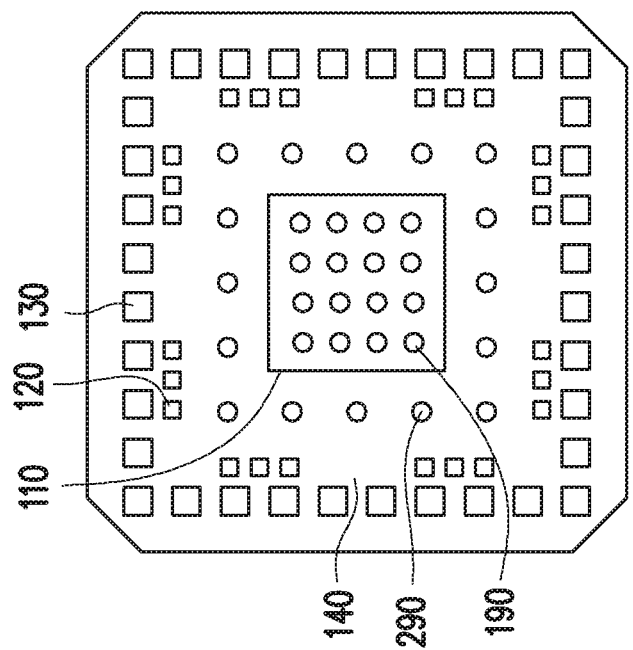
Figure 7C:
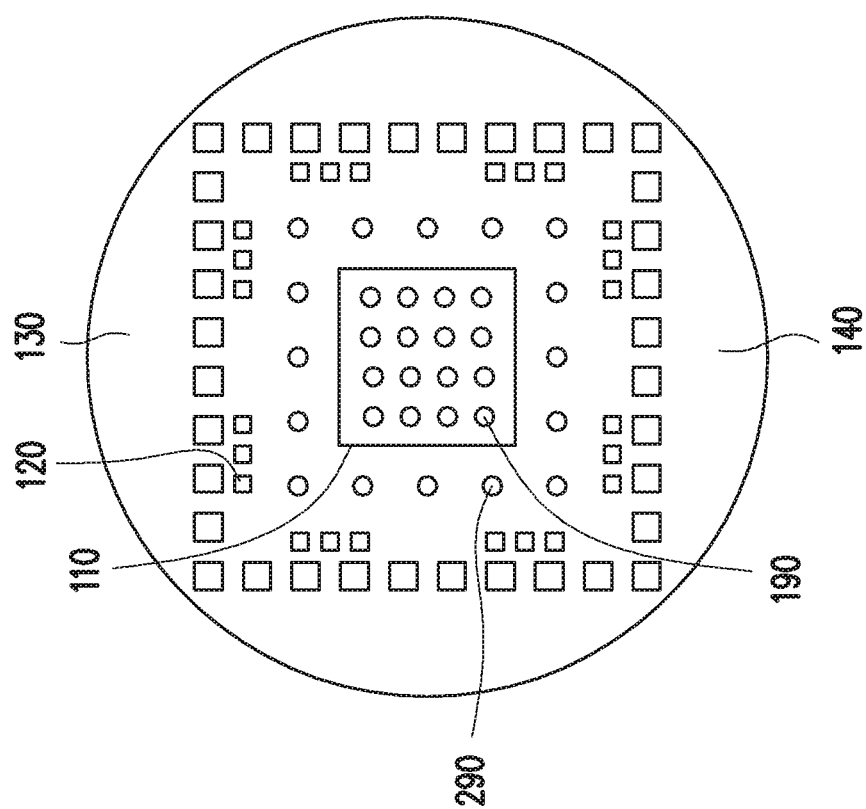

The first functional die 110 may be a single die as illustrated in FIG. 1B, or in some embodiments, two or more than two dies may be attached. The second functional die 120 and the dummy die 130 may include multiple dies, for example, as illustrated in FIG. 1B, or in some embodiment, the second functional die 120 and the dummy die 130 could be a single die for any suitable approaches. The first functional die 110 is an ultra-large die, which has a size (i.e., length*width) of about 900 mm$^2$ to 90000 mm$^2$ in accordance with some embodiments. Alternatively, the first functional die has a size of about 40000 mm$^2$ to about 80000 mm$^2$. In an embodiment, the first functional die 110 has a size of around 50,000 mm$^2$. For example, the first functional die 110 may have a length of about 200 mm to about 320 mm and a width of about 200 mm to about 320 mm. For example, the first functional die 110 may have a length that is larger than a lithography reticle's length (e.g., 32 mm). Alternatively, the first functional die may at least have a width that is larger than a lithography reticle's width (e.g., 26 mm). In some embodiments, the first functional die 110 has a size (i.e., length*width) at least 25 times larger than that of the second functional die 120, which is an ordinary functional die. In other embodiments, the first functional die 110 has a size of at least 50 or 100 times larger than that of the second functional die 120. The first functional die 110 may be circular, square, or rectangular in a top view, for example, as illustrated in FIG. 7A. In other embodiments, the first functional die 110 may be square or rectangular with rounded corners in a top view, for example, as illustrated in FIG. 7B. The rounded corners may help reduce the warpage resulting from the ultra-large size of the first functional die 110. In some embodiments, the first functional die 110 is thicker than the second functional die 120 (not shown in figures). For example, the first functional die 110 may have a thickness of about 500 mm to about 750 mm, and the second functional die 120 may have a thickness of about 500 mm to about 750 mm. In another example, the first or the second functional die, or both, may have a thickness of about 300 mm or more.

The first functional die 110 and the second functional die 120 may provide a distinct and different function although they can also provide the same function. Examples of the functional dies 110 and 120 include, but are not limited to, active devices such as digital cores (e.g., digital signal processing (DSP) core), central processing units (CPU), graphics processing units (GPU), field programmable gate array (FPGA), artificial intelligence (AI), an application-specific integrated circuit (ASIC) accelerators, input/output (I/O) dies, static random access memory (SRAM), and passive devices such as integrated passive device (IPD) (e.g., inductors (L), capacitors (C), resistors, transformers, and the like), low dropout (LDO) components, integrated voltage regulator (IVR) components, or the like, or a combination thereof, or the like. Although only first functional die 110 and second functional dies 120 are illustrated for clarity, those skilled in the art will recognize that more functional dies can be integrated into the package with various arrangements and configurations. In some embodiments, the dummy dies 130 are made of bare dies and electrically isolated from the functional dies 110 and 120.

For example, the first functional die 110 may perform a first function that requires a higher computing function (e.g., AI), and the second functional die 120 may perform a second function (e.g., I/O or memory die)). The second functional dies 120 are arranged in rows and columns near the periphery of the first functional die 110 in accordance with some embodiments. The dummy dies 130 may be arranged in rows and columns near the periphery of rows and columns of second functional dies 120 and separated from the first functional die 110 by the second functional dies 120, as illustrated in FIGS. 7A and 7B. In other embodiments, the dummy dies 130 are arranged in rows and columns near the periphery of the first functional die and separate the second functional dies 120 from the first functional die 110.

Referring back to FIG. 1B, the first functional die 110 includes a first side 110a and a second side 110b, the second side 110b being opposite the first side 110a. The first side 110a of the first functional die 110 is coupled to the insulating material 104. The second functional die 120 includes a first side 120a and a second side 120b opposite to each other. The second side of the second functional die 120 is coupled to the insulating material 104. The first side 110a and 120a do not have contact pads formed thereon and are also referred to as the back side or non-active side of the functional dies. The second sides 110b and 120b are also referred to as the front side or active side of the functional dies.

Each of the functional dies 110 and 120 includes a substrate. The substrate includes a wide variety of active and passive devices formed in its active areas. The active and passive devices such as transistors, capacitors, resistors, inductors, and the like that may be used to generate the desired structural and functional requirements of the design for each of the functional dies. The substrate also includes other non-functional features such as testing lines, or scribe lines formed in its peripheral areas.

The first functional die 110 and the second functional die 120 each includes a plurality of contact features 114 and 124 formed across the second sides 110b and 120b thereof. The contact features 114 and 124 are electrically coupled to the substrate inside the functional die. The contact features 114 and 124 include a conductive material such as copper, aluminum, other metals, or alloys or multiple layers thereof, as examples. Alternatively, the contact features 114 and 124 may include other materials. The contact features 114 and 124 may have a pillar shape and encapsulated by insulating layers 116 and 126, respectively. The insulating layer 116 and 126 may include polyimide (PI), polybenzoxazole (PBO), benzocyclobutene (BCB), or multiple layers or combinations thereof in some embodiments, as examples.

An encapsulating material 140 is then formed over the insulating material 104 to encapsulate first functional die 110, second functional dies 120, and dummy dies 130, as illustrated in FIG. 1C. The encapsulating material 140 is applied using a wafer-level or panel-level encapsulating process in some embodiments, for example. The encapsulating material 140 may include a molding material. For example, the encapsulating material 140 may include an epoxy, an organic polymer, a polymer with or without a silica-based or glass filler added, or other materials, as examples. The encapsulating material may be molded using, for example, compressive molding, transfer molding, or other methods. In some embodiments, the encapsulating material 140 includes a liquid molding compound (LMC) that is a gel type liquid when applied. The encapsulating material 140 may also include a liquid or solid when applied. Alternatively, the encapsulating material 140 may include other insulating and/or encapsulating materials. The package 100 after forming the encapsulating material 140 may have a size of about 1.1 times to about 4 times greater than that of the first functional die 110.

Next, the encapsulating material 140 is cured using a curing process in some embodiments. The curing process may include heating the encapsulating material 140 to a predetermined temperature for a predetermined period of time, using an anneal process or other heating processes. The curing process may also include an ultra-violet (UV) light exposure process, an infrared (IR) energy exposure process, combinations thereof, or a combination thereof with a heating process. Alternatively, the encapsulating material 140 may be cured using other methods. In some embodiments, a curing process is not included.

A top portion of the encapsulating material 140 is then removed, as illustrated in FIG. 1D. The top portion of the encapsulating material 140 is removed using a grinding process in some embodiments, for example. In some embodiments, a chemical-mechanical polishing (CMP) process is used to remove the top portion of the encapsulating material 140, for example. A combination of a grinding process and a CMP process may be used. The CMP process or grinding process may be adapted to stop when the contact features 114 and 124 reached in some embodiments, for example. For example, the CMP process and/or grinding process may be adapted to stop after the solder portion (not shown) of the contact features 114 and 124 are removed.

In some embodiments, a top surface of the encapsulating material 140 after the grinding and/or CMP process is substantially coplanar with the second sides 110b and 120b of the functional dies 110 and 120. The top surface of encapsulating material 140 is substantially coplanar with the second sides 110b and 120b of functional dies 110 and 120 advantageously facilitate in the formation of a subsequently formed redistribution layer (RDL) structure 150, which is illustrated in FIG. 1E.

The RDL structure 150 is formed over the first functional die 110, second functional die 120, dummy die 130, and encapsulating material 140, in some embodiments, as illustrated in FIG. 1E. The RDL structure 150 may include one or more dielectric layers 152 and a plurality of conductive structures 154 (e.g., lines and/or vias) formed inside the one or more dielectric layers 152. The formation of RDL structure 150 may include patterning (e.g., using subtractive etch and/or damascene techniques) dielectric layers 152 and forming conductive structures 154 (e.g., using one or more sputtering processes, photolithography processes, plating processes, and photoresist strip processes, as examples) in the dielectric layers 152.

The one or more dielectric layers 152 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as a spin-on coating technique, and the like. Conductive structures 154 may be formed of copper or a copper alloy although other metals such as aluminum, gold, and the like may also be used. Conductive structures 154 may be physically and electrically connected to contact features 114 and 124 in dies 110 and 120.

In some embodiments, contact pads 156 formed over a top surface of the RDL structure 150. The contact pads 156 may include under-ball metallization (UBM) structures in some embodiments. The UBM can provide better adhesive and stress buffer for the connectors attached in the subsequent processes. The UBM may include a material formed of copper, titanium, tungsten, aluminum, or the like.

Connectors 160 and/or die 170 may then be arranged over the contact pads 156, as illustrated in FIG. 1E. Connectors 160 may be ball grid array (BGA) connectors, lead-free solder balls, controlled collapse chip connection (C4) bumps, electroless nickel electroless palladium immersion gold (ENEPIG) formed bumps, or the like. The connectors 160 may include a conductive material such as solder, gold, nickel, silver, palladium, tin, the like, or a combination thereof. Connectors 160 may make electrical connections to another device, another packaged semiconductor device, or to a circuit board or other object in an end application, as examples. Die 170 may be coupled to contact pads 156 by a plurality of connectors 172. Die 170 may be a functional die, for example, an integrated circuit die or passive device die. Connectors 172 may include solder bumps coupling to a bottom side of the die 170 or two sides of the die 170. In some embodiments, modules (not shown in Figures), such as power modules, may also be disposed over and coupled to the contact pads 156.

Once the connectors 160 and die 170 have been mounted, the device 100 may be flipped over and placed for example on another carrier (not shown), for example, a tape, in preparation for further processing. The carrier 101 is then removed, as illustrated in FIG. 1F, in accordance with some embodiments. For example, the carrier 101, the release layer 102, and the insulating material 104 may be removed by exposing the release layer 102 to heat or UV.

Interfacing material 180 and a heat dissipating feature 182 are disposed over the sides 110a and 120a of the dies 110 and 120 in accordance with some embodiments, as illustrated in FIG. 1G. For example, the interfacing material 180 and the heat dissipating feature 182 are disposed over the dies 110/120 and the encapsulating material 140. Interfacing material 180 may include a thermal interface material (TIM), for example, a polymer having a good thermal conductivity, which may be between about 3 watts per meter kelvin (W/m·K) to about 5 W/m·K or more. The TIM may have good thermal conductivity and may be disposed of between dies 110 and 120 and heat dissipating feature 182. Furthermore, interfacing material 180 may also include an adhesive (e.g., an epoxy, silicon resin, and the like) for affixing heat dissipating feature 182 to dies 110/120 and the encapsulating material 140. The heat dissipating feature 182 may further have a high thermal conductivity, for example, between about 200 W/m·K to about 400 W/m·K or more, and may be formed using a metal, a metal alloy, graphemegraphene, carbon nanotubes (CNT), and the like.

Once the heat dissipating feature 182 has been attached, screw assemblies 190 may be attached by initially forming bolt holes through the heat dissipating feature 182, interfacing material 180, adhesive layer 108, first functional die 110, and RDL structure 150, as illustrated in FIG. 1H. The bolt holes may be formed by a drilling process such as laser drilling, mechanical drilling, or the like.

Once the bolt holes have been formed, the screw assemblies 190 may be used to further fasten the heat dissipating feature 180 to the package 100 and apply the desired amount of pressure to the interfacing material 180 to make the interfacing material 180 sufficiently adhere to heat dissipating feature 182. The screw assemblies 190 include bolts 192, fasteners 194, and mechanical braces 196, according to some embodiments. The bolts 192 are threaded through corresponding bolt holes in the mechanical braces 196, heat dissipating feature 182, interfacing material 180, adhesive layer 108, first functional die 110, and RDL structure 150. The fasteners 194 are threaded onto the bolts and tightened to clamp the interfacing material 180 between the heat dissipating feature 182 and the encapsulating material 140. The fasteners 194 may be, e.g., nuts that thread to the bolts 192. The fasteners 194 attach to the bolts 192 at both sides of the package (e.g., at the side having the heat dissipating feature and at the side having the RDL structure).

During fastening, the fasteners 194 are tightened, thereby increasing the mechanical force applied to the interfacing material 180 by the mechanical braces 196 and the encapsulating material 140. The mechanical braces 196 are rigid supports that may be formed from a material with high stiffness, such as a metal, e.g., steel, titanium, cobalt, or the like. The fasteners 194 are tightened until the heat dissipating feature 182 and the encapsulating material 140 exert the desired amount of pressure on the interfacing material 180. For example, the tightening of the fasteners 194 may be performed with a torque in the range of about 20 N·m to about 30 N·m. However, any suitable torque may be used. In some embodiments, the bolt 192 has a diameter of around 1 mm to around 10 mm. In other embodiments, the bolt 192 has a diameter of around 2 mm to around 5 mm.

The size of the package has been increased (e.g., over 25,000 mm$^2$) due to the integration of the ultra-large die (e.g., the first functional die 110) in accordance with some embodiments. Thus, the locations of the screw assemblies become a factor that would impact the adhesive performance of interfacing material 180 to heat dissipating feature 182. For example, the screw assemblies 190 may be threaded through a portion of the first functional die 110 to exert the desired amount of pressure on a portion of the interfacing material 180 over the first functional die 110 in accordance with some embodiments, as illustrated in FIG. 1H. In some embodiments, because of the ultra-large size of the first functional die 110, the first functional die 110 may have sufficient areas of the peripheral areas that could allow the screw assemblies 190 threading through and not sacrificing areas of the active areas or damaging the active and passive devices in the active areas inside the first functional die 110.

Figure 2:
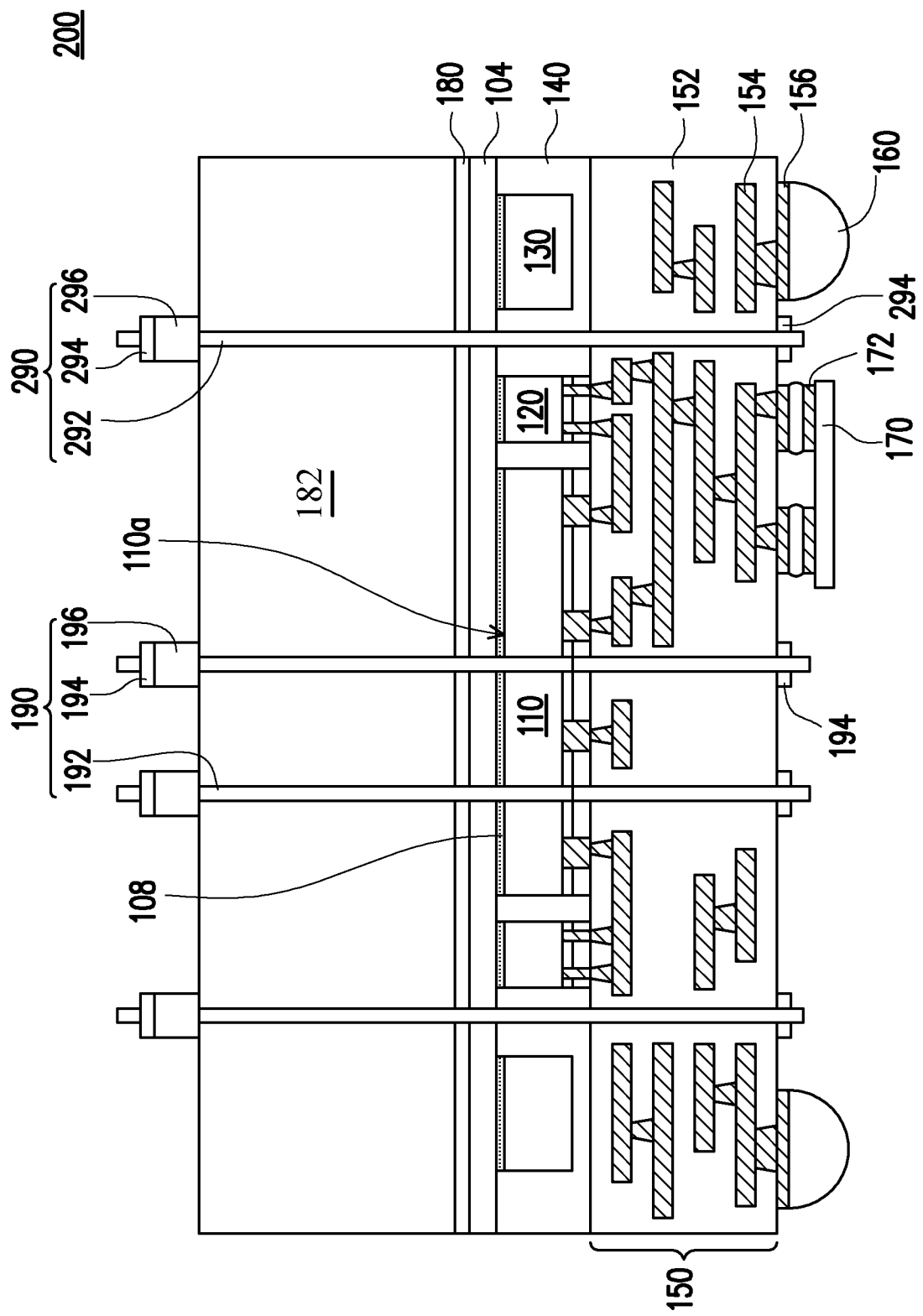
FIGS. 2 through 6 are schematic cross-sectional views showing various packages according to some exemplary embodiments of the present disclosure.

In some embodiments, in addition to the screw assemblies 190, screw assemblies 290 are also threaded through the encapsulating material 140 to apply the desired amount of pressure on each portion of the interfacing material 180, as illustrated in FIG. 2. In other embodiments, the screw assemblies may be further threaded through the dummy die 130 (not shown). However, the screw assemblies 290 are not threaded through the second functional die 120 because of the size of the second functional die 120 in accordance with some embodiments. Screw assemblies 290 threading through the encapsulating material 140 and near the ordinary size functional die would generate sufficient torques to the portion of the interfacing material 180 over the center of the ordinary functional die (e.g., the second functional die 120) because the distance between the screw assemblies and the center of the die is not far. In addition, the peripheral areas in an ordinary size functional die (e.g., the second functional die 120) may not have sufficient space to allow one or multiple screw assemblies threading through without sacrificing the active areas.

Figure 3:
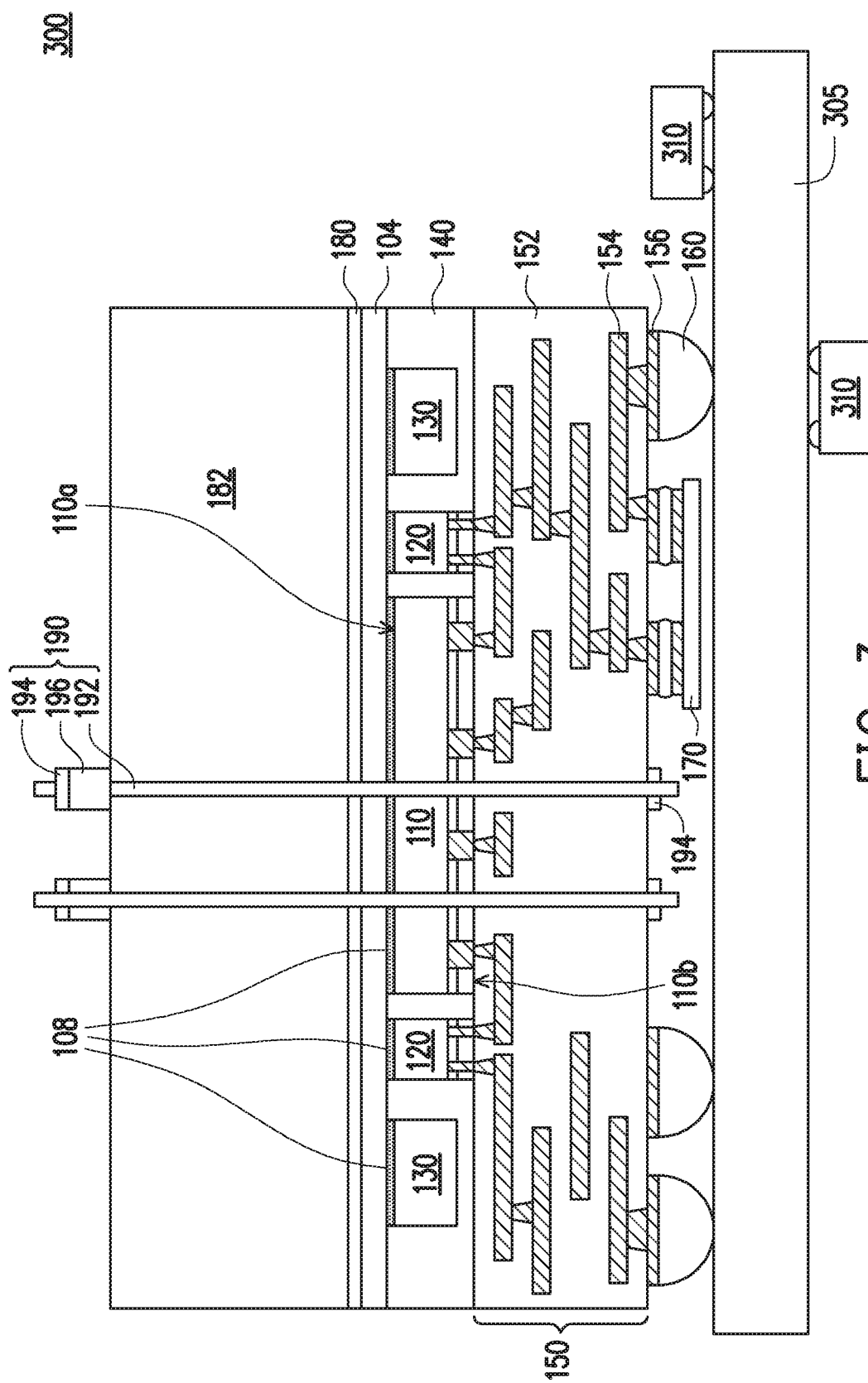

FIG. 3 illustrates attaching the package 100 as illustrated in FIG. 1H to a system substrate. For example, the package 100 may attach a substrate 305 through the connectors 160 to form package 300. The substrate 305 may be a printed circuit board (PCB) or an organic substrate that is designed to provide system function and interfaces for other module integration. Other devices (e.g., passive devices), modules (e.g., power module integrated circuit (PMIC) or other functional modules), or packages may be mounted on a side of the substrate 305 or both sides of the substrate 305 to provide system functionality. For example, as illustrated in FIG. 3, modules 310 are mounted on both sides of the substrate 305.

Figure 4:
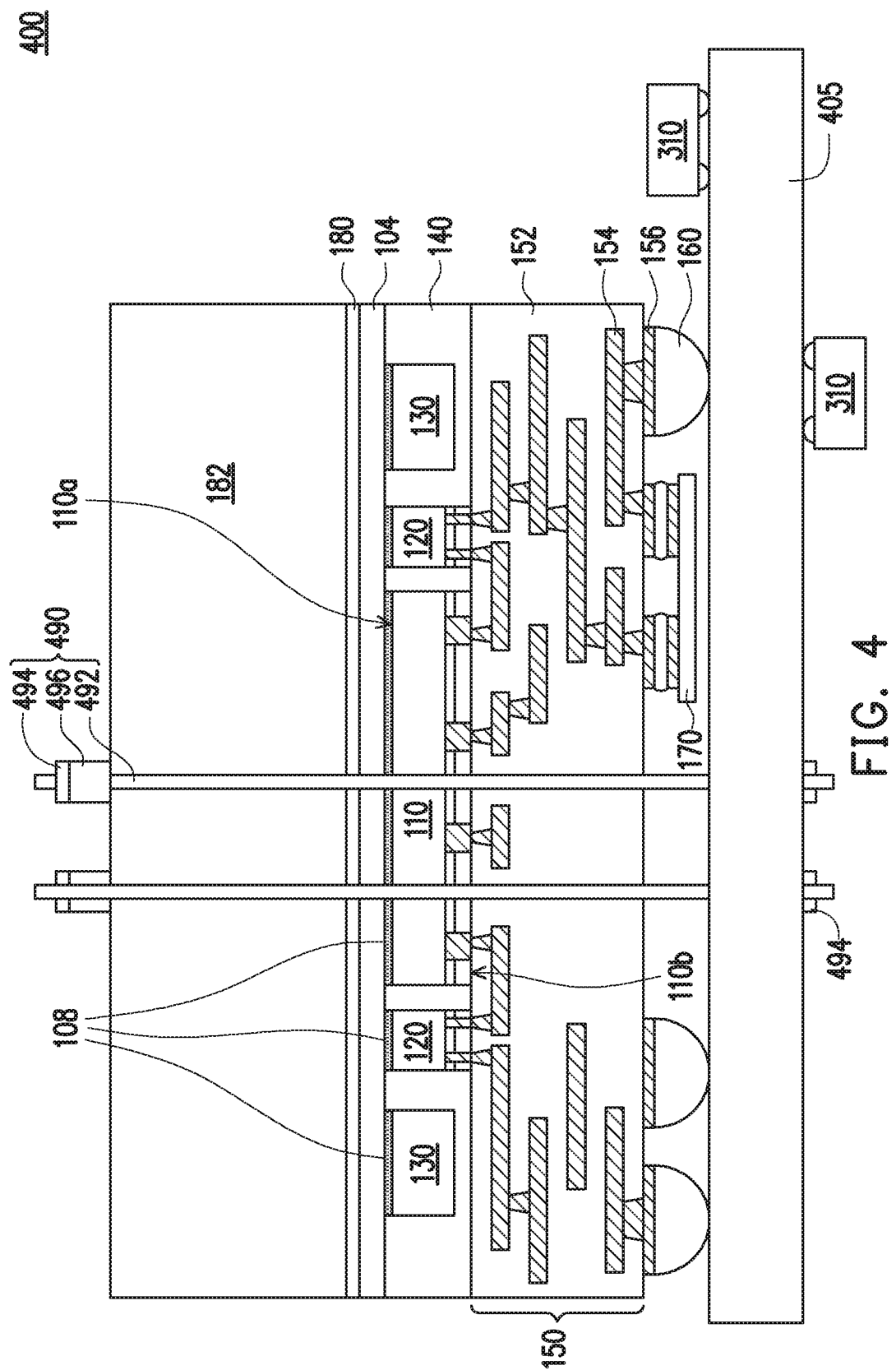

FIG. 4 illustrates attaching the package 100 at the stage in FIG. 1G to a system substrate in accordance with another embodiment of the present disclosure. For example, the package 100 as illustrated in FIG. 1H may attach to a substrate 405 through the connectors 160 to form package 400. The substrate 405 may be a PCB or an organic substrate that is designed to provide system function and interfaces for other module integration. Other devices (e.g., passive devices), modules (e.g., power module integrated circuit (PMIC) or other functional modules), or packages may be mounted on a side of the substrate 405 or both sides of the substrate 405 to provide system functionality. For example, as illustrated in FIG. 4, modules 310 are mounted on both sides of the substrate 405.

In some embodiments, after package 100 at the stage illustrated in FIG. 1G is attached to the substrate 405 to form package 400, and the screw assemblies 490 are mounted. For example, bolt holes through the heat dissipating feature 182, interfacing material 180, adhesive layer 108, first functional die 110, RDL structure 150, and system substrate 405 are initially formed. Once the bolt holes have been formed, the screw assemblies 490 includes bolts 492, fasteners 494, and mechanical braces 496. The bolts 492 are threaded through corresponding bolt holes in the mechanical braces 496, heat dissipating feature 182, interfacing material 180, adhesive layer 108, first functional die 110, RDL structure 150, and the system substrate 405. The fasteners 494 tightened to clamp the interfacing material 180 between the heat dissipating feature 182 and the encapsulating material 140. The fasteners 494 attach to the bolts 492 at both sides of the package (e.g., at the side having the heat dissipating feature 182 and at the side having the substrate 405). Because the substrate 405 may be a PCB or other boards more rigid than the RDL structure 150, the fasteners 494 may apply more pressure on the substrate 405 than on the RDL structure 150, and thus more pressure may be applied on the interfacing material 180. Although FIG. 4 only illustrates that the screw assemblies 490 are threaded through the first functional die 110, those skilled in the art would know other arrangements of the functional dies and screw assemblies within the scope the present disclosure can be implemented, and not limited to the embodiments of the present disclosure.

Figure 5:
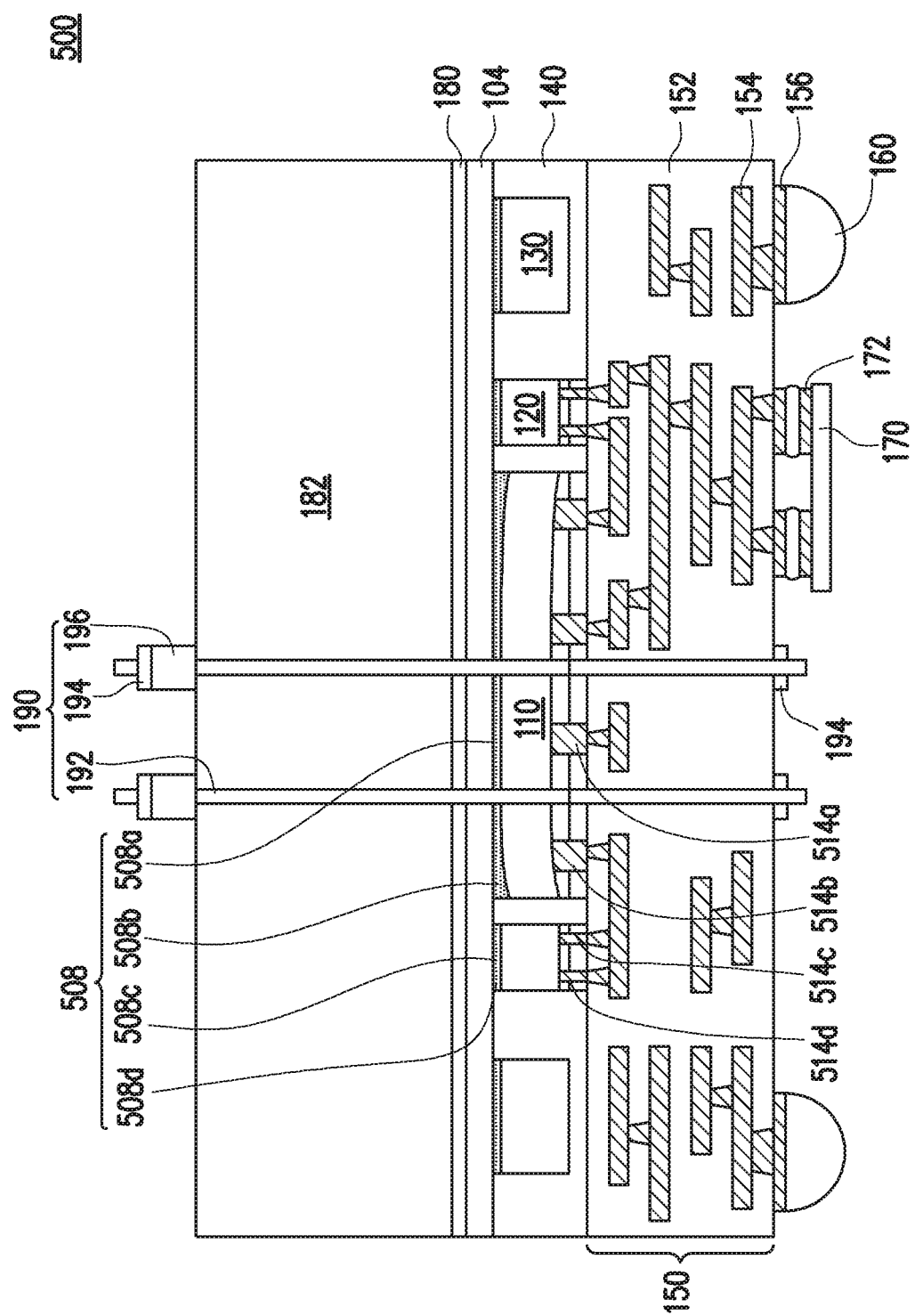
Figure 6:
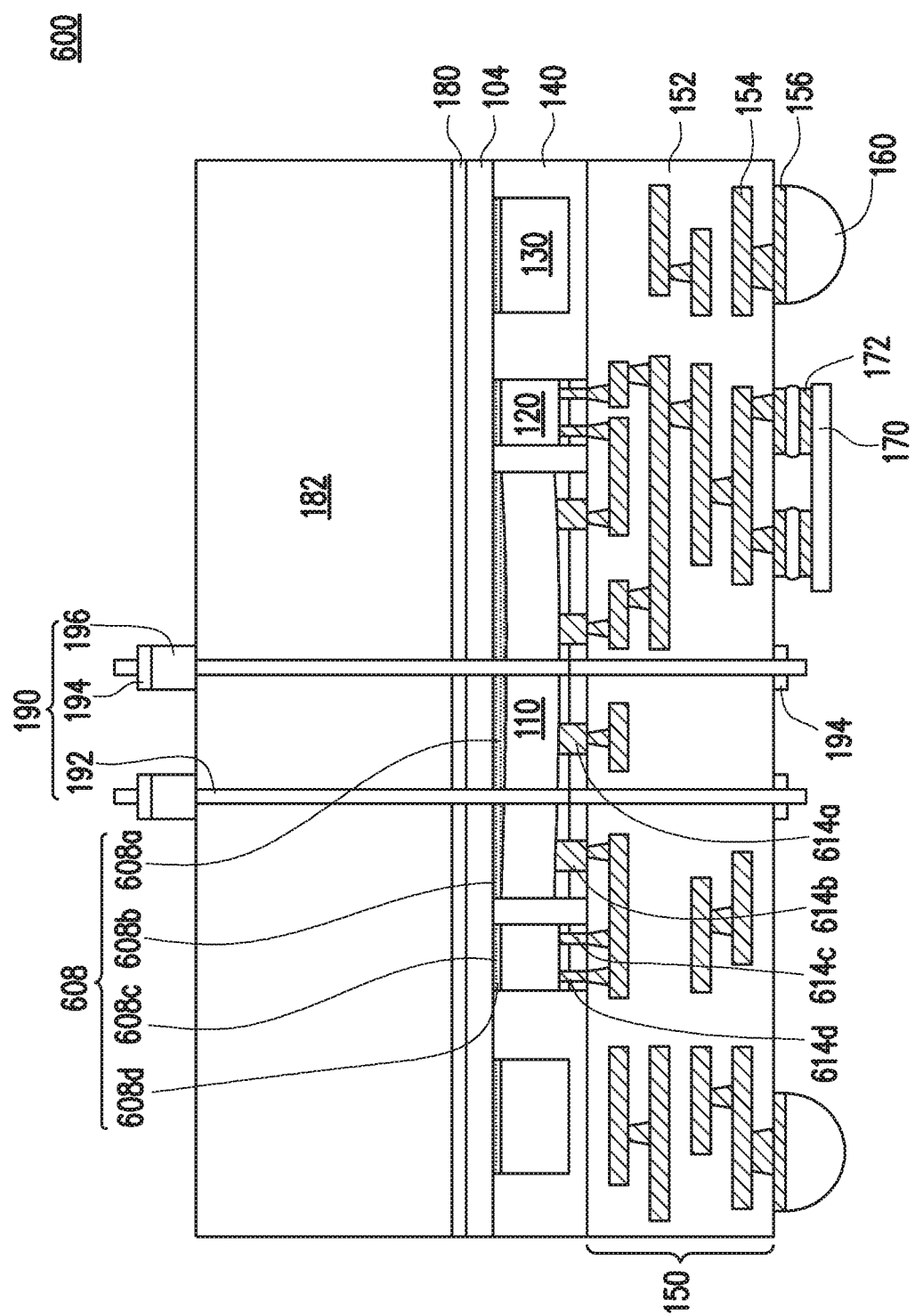

FIGS. 5 and 6 illustrate packages 500 and 600 according to some embodiments of the present disclosure. For example, because the first functional die 110 has an ultra-large size, an amount of warpage is generated, and which causes the first functional die 110 to be warped. For example, FIG. 5 illustrates the first functional die 110 has corners warped upwardly (e.g., facing the RDL structure 150). The adhesive layer 508 underneath the first functional die 110 has a center portion 508a and an edge portion 508b. The edge portion 508b may have a thickness greater than that of the center portion 508a. For example, the thickness difference of the edge portion 508b and the center portion 508a is about 5 μm to about 30 μm. Accordingly, the first functional die 110 is suitably attached to the insulating material 104 through the adhesive layer 508.

The first functional die 110 may have contact features 514a located at the center portion of the first functional die 110 and contact features 514b located at the edge portions of the first functional die 110. Although the contact features 514a and 514b can be grown to the same height from the surface of the substrate, as illustrated in FIG. 1B, the contact features 514b may have a height shorter than that of the contact features 514a after the grinding process as illustrated in FIG. 1D. For example, the height difference of the contact features 514a and 514b is about 5 μm to about 30 μm. In some embodiments, the second functional die 120 has less warpage than the first functional die. The second functional die 120 may have a flat upper and bottom surface or may have less seriously curved upper and bottom surfaces as compared to the first functional die 110. Thus, the adhesive layer 508 underneath the second functional die 120 may have a substantially uniform thickness in accordance with some embodiments. In other embodiments, the adhesive layer 508 underneath the second functional die 120 may have a center portion 508c and an edge portion 508d. The center portion 508c of the adhesive layer 508 underneath the second functional die 120 is thinner than that of the edge portion 508d. The thickness difference between the center portion 608c and the edge portion 608d of the adhesive layer 608 underneath the second functional die 120 is less than the thickness difference between the center portion 508a and the edge portion 508b of the adhesive layer 508 underneath the first functional die 110. In some embodiments, the second functional die 120 may have contact features 514c at its center portion and contact features 514d—at its edge portion. In some embodiments, the contact features 514c—are taller than the contact features 514d, and the height difference of the contact features 514c and 514d is less than the height difference between contact features 514a and 514b.

For example, FIG. 6 illustrates the first functional die 110 has corners warped downwardly (e.g., facing the heat dissipating feature 182). The adhesive layer 608 underneath the first functional die 110 has a center portion 608a and an edge portion 608b. The edge portion 608b may have a thickness smaller than that of the center portion 608a. For example, the thickness difference of the edge portion 608b and the center portion 608a is about 5 μm to about 30 μm. Accordingly, the first functional die 110 is suitably attached to the insulating material 104 through the adhesive layer 608.

The first functional die 110 may have contact features 614a located at the center portion of the first functional die 110 and contact features 614b located at the edge portions of the first functional die 110. Although the contact features 614a and 614b can be grown to the same height from the surface of the substrate, as illustrated in FIG. 1B, the contact features 614b may have a height greater than that of the contact features 614d after the grinding process as illustrated in FIG. 1C. For example, the height difference of the contact features 614a and 614b is about 5 μm to about 30 μm. In some embodiments, the second functional die 120 has less warpage than the first functional die. The second functional die 120 may have flat upper and bottom surfaces or may have less seriously curved upper and bottom surfaces as compared to the first functional die 110. Thus, the adhesive layer 608 underneath the second functional die 120 may have a substantially uniform thickness in accordance with some embodiments. In other embodiments, the adhesive layer 608 underneath the second functional die 120 may have a center portion 608c and an edge portion 608d. The center portion 608c of the adhesive layer 608 underneath the second functional die 120 is thicker than that of the edge portion 608d. The thickness difference between the center portion 608c and the edge portion 608d of the adhesive layer 608 underneath the second functional die 120 is less than the thickness difference between the center portion 608a and the edge portion 608b of the adhesive layer 608 underneath the first functional die 110. In some embodiments, the second functional die 120 may have contact features 614c at its center portion and contact features 614d at its edge portion. In some embodiments, the contact features 614c are shorter than the contact features 614d, and the height difference of the contact features 614c and 614d is less than the height difference between 614a and 614b.

FIGS. 7A to 7E are planar views of packages according to various embodiments of the present disclosure. It should be noted that the packages in FIGS. 7A to 7E are for illustration only, and the embodiments in FIGS. 7A to 7E are within the contemplated scope of this disclosure that the structures described with reference to FIG. 1A to FIG. 6. For example, FIGS. 7A and 7B may be planar views of the package 200 illustrated in FIG. 2, however, those skilled art would understand the shape of the functional die and the arrangements of the dies can be applied to any other embodiments of the present disclosure. For example, referring to FIGS. 7C and 7D, the package 700 may have a square or rectangular shape with a rectangular shape or a rounded shape (by cutting the corners) or a round shape. The shape of the package can be decided by the shape of the carrier 101 as illustrated in FIG. 1A or limited by processes or manufacturing equipment in the industry, and the package shape may be applied to various embodiment of the present disclosure regardless of the arrangements and configurations of the dies, screw assemblies, or other features.

Figure 7E:
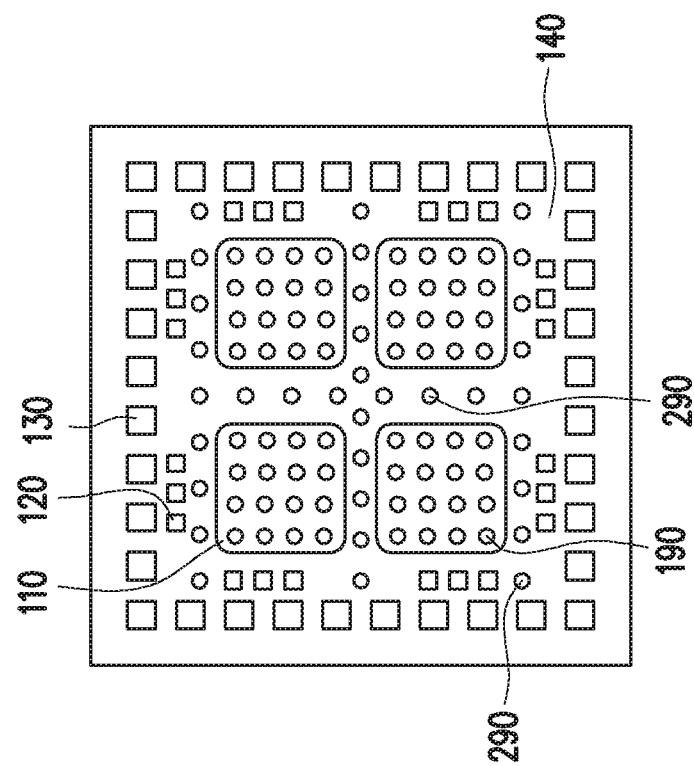
Figure 8:
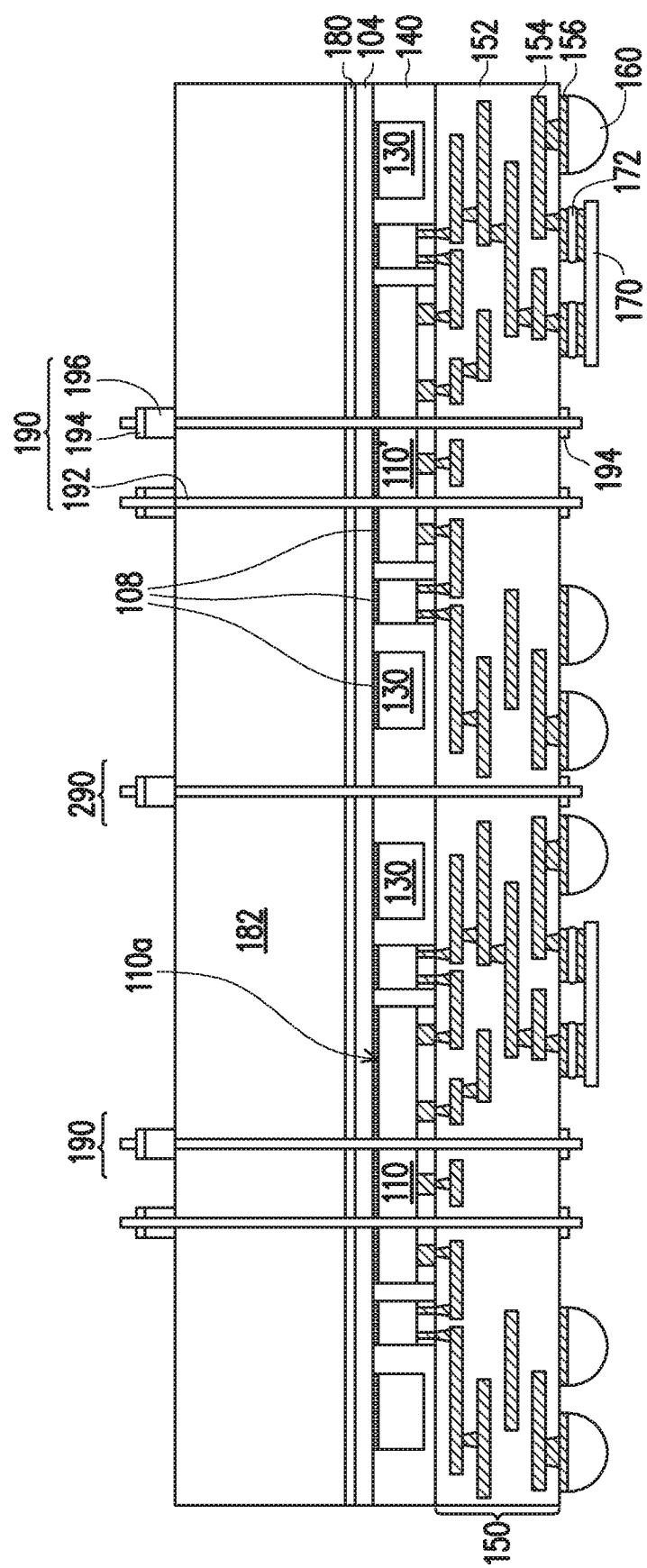
FIG. 8 is a schematic cross-sectional view showing another package according to an exemplary embodiment of the present disclosure.

FIG. 7E illustrates a package in accordance with some embodiments of the present disclosure. FIG. 8 illustrates a sectional view corresponding to the embodiment of FIG. 7E. The package in FIGS. 7E and 8 may have multiple first functional dies arranged at the center portions of the package. In this embodiment, each of the first functional dies 110 provides the same as or different functions from other first functional dies 110. The screw assemblies 190 may be threaded through the first functional dies 110. Screw assemblies 290 may be threaded through a portion of the encapsulating material 140 disposed between the first functional dies 110, and a portion of the encapsulating material disposed peripheral to the second functional dies 120 and dummy dies 130 in accordance with some embodiments. Die 170 or modules such as power modules may be disposed over and coupled to the contact pads 156.

Figure 9:
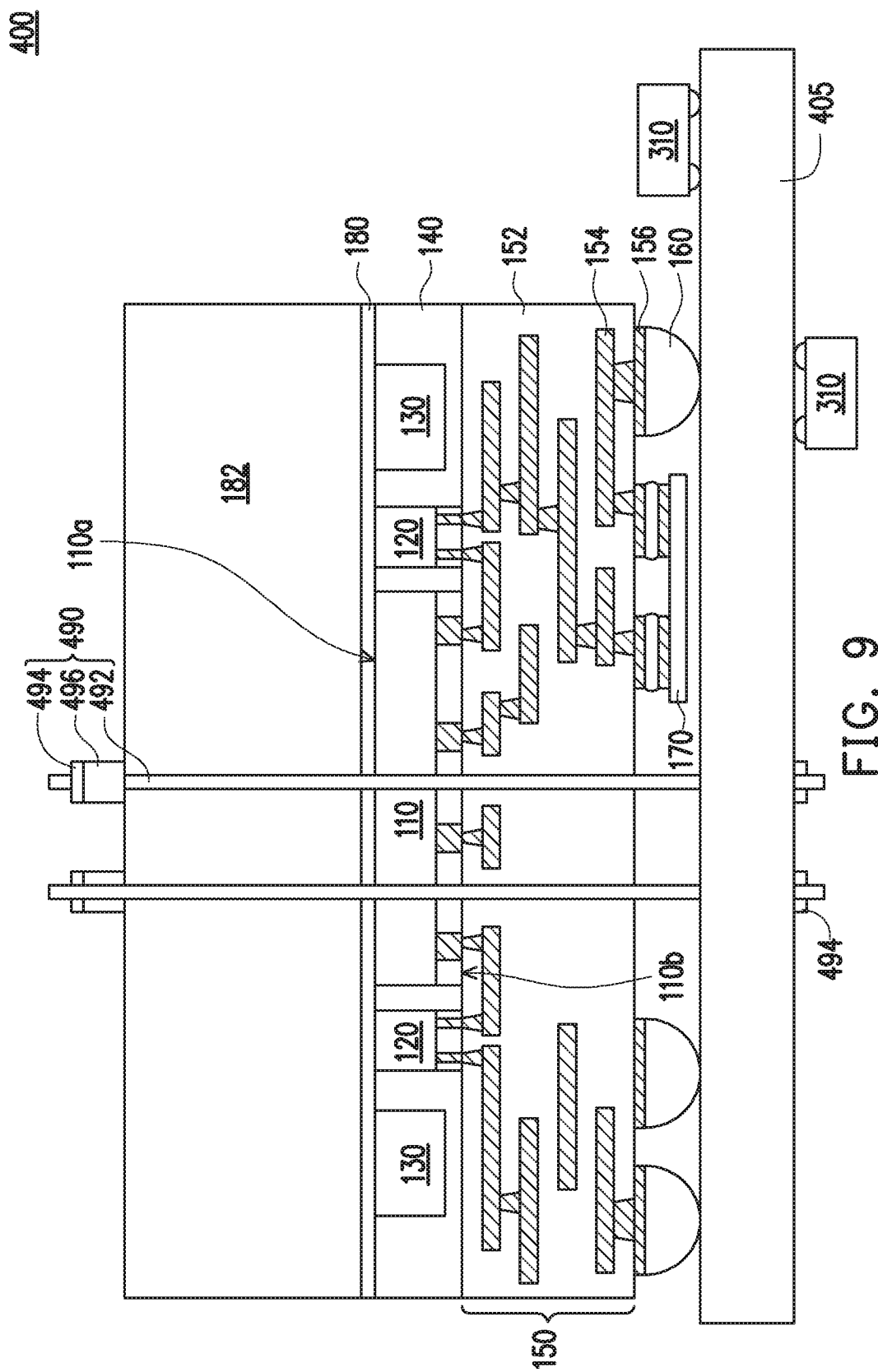
FIG. 9 is a schematic cross-sectional view showing another package according to an exemplary embodiment of the present disclosure.

In the above embodiments, insulating material 104 and adhesive layer 108 remain after the carrier is removed, as shown in FIG. 1F. It should be noted that insulating material 104 and adhesive layer 108 could be removed along with (or subsequent to removing) the carrier, resulting in the structure illustrated in FIG. 9. FIG. 9 corresponds to the embodiment of FIG. 4 wherein insulating material 104 and adhesive layer 108 are removed with the carrier. This could apply equally to the embodiments shown in FIGS. 5 and 6 and the other embodiments described herein and intended to be within the scope of the claims appended hereto.

In accordance with an embodiment, a package includes: a first die having a first side and a second side opposite to each other; an encapsulating material surrounding the first die; a redistribution layer (RDL) structure disposed over the first side of the first die and the encapsulating material; a heat dissipating feature disposed over the second side of the first die and the encapsulating material; and a first screw assembly penetrating through the first die, the RDL structure and the heat dissipating feature.

In accordance with another embodiment, a package includes: a first functional die and a second functional die surrounded by an encapsulating material, wherein the first functional die has a size greater than that of the second functional die; a redistribution layer (RDL) structure disposed over a first side of the first functional die, a first side of the second functional die, and a first side of the encapsulating material; a heat dissipating feature disposed over a second side of the first functional die, a second side of the second functional die, and a second side of the encapsulating material; and a first screw assembly penetrating through the first die, the RDL structure, and the heat dissipating feature.

In accordance with yet another embodiment, a method includes: disposing a first die over a carrier, wherein the first die has a first side and a second side opposite to the first side; forming an encapsulating material surrounding the first die; grinding the first die and the encapsulating material from the second side of the first die; forming a redistribution layer (RDL) structure over the second side of the first die and the encapsulating material; removing the carrier; disposing a heat dissipating feature over the first side of the first die, and disposing a screw assembly that penetrates through the first die, the RDL structure, and the heat dissipating feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
a first chip having a top surface and a bottom surface opposite to each other, the first chip including a semiconductor die having formed therein active devices, and at least one side extending from the top surface of the first chip to the bottom surface of the first chip;
a second chip having a top surface and a bottom surface opposite to each other, the second chip including a second semiconductor die having formed therein active devices, and at least one side extending from the top surface of the second chip to the bottom surface of the second chip, the second chip being physically separated from the first chip by a gap;
an encapsulating material surrounding the first chip and the second chip, wherein the encapsulating material fills the gap between the at least on side of the first chip and the at least one side of the second chip;
a redistribution layer (RDL) structure disposed over the top surface of the first chip and over the top surface of the second chip;
a heat dissipating feature disposed over the bottom surface of the first chip and over the bottom surface of the second chip, and an interface material between the heat dissipating feature and the first chip and between the heat dissipating feature and the second chip; and
a first screw assembly penetrating through the semiconductor die of the first chip, the RDL structure and the heat dissipating feature, wherein a portion of the first screw assembly is completely surrounded by the semiconductor die of the first chip in a top view.

2. The package of claim 1, wherein the first screw assembly includes a mechanical brace configured to apply mechanical force to the interface material.

3. The package of claim 1, wherein the first chip has a length or a diameter of about 250 mm to about 320 mm.

4. The package of claim 1, wherein the first chip has rounded corners.

5. The package of claim 1, further comprising a second screw assembly penetrating through the encapsulating material, the RDL structure, and the heat dissipating feature.

6. The package of claim 5, wherein the first screw assembly comprises a bolt having a diameter of about 1 mm to about 10 mm.

7. The package of claim 6, further comprising a substrate attaching to the RDL structure through connectors, and the first screw assembly penetrates through the substrate.

8. The package of claim 1, further comprising an adhesive layer disposed between the first chip and the heat dissipating feature, and wherein the first screw assembly penetrates through the adhesive layer.

9. The package of claim 8, wherein the adhesive layer has a center portion and an edge portion, and the thicknesses of the center portion and the edge portion are different.

10. The package of claim 1, wherein the bottom surface of the first chip is level with the bottom surface of the second chip and further wherein the top surface of the first chip is level with the top surface of the second chip.

11. The package of claim 10, further comprising a third chip surrounded by the encapsulating material, wherein the third chip is electrically isolated from the first chip.

12. A package, comprising:
a first functional die having a top surface including contact features, a bottom surface, and a sidewall connecting the top surface and the bottom surface;
a second functional die, physically separated from the first functional die by a gap, and having a top surface, including second contact features, level with the top surface of the first functional die, a bottom surface level with the bottom surface of the first functional die, and a sidewall connecting the top surface of the second functional die and the bottom surface of the second functional die;
an encapsulating material filling the gap between the first functional die and the second functional die, and contacting the sidewall of the first functional die and the sidewall of the second functional die, a top surface of the encapsulating material being level with the top surface of the first functional die and the top surface of the second functional die, the first functional die including a substrate, the substrate including active devices formed therein;
a redistribution layer (RDL) structure disposed on and contacting the top surface of the first functional die, the top surface of the second functional die, and top surface of the encapsulating material;
a heat dissipating feature disposed over the bottom surface of the first functional die, the bottom surface of the second functional die, and a bottom surface of the encapsulating material; and
a first screw assembly penetrating through the substrate of the first functional die, the RDL structure, and the heat dissipating feature, the first screw assembly being completely surrounded by the substrate of the first functional die in a region where the first screw assembly penetrates through the substrate of the first functional die.

13. The package of claim 12, further comprising a second screw assembly penetrating through the encapsulating material, the RDL structure, and the heat dissipating feature.

14. The package of claim 12, wherein the RDL structure has a size at least two times greater than that of the second functional die.

15. The package of claim 12, further comprising a system substrate attached to the RDL structure, and wherein the first screw assembly penetrates through the system substrate.

16. The package of claim 12, wherein the first functional die comprises first contact features at its center and second contact features at its edge, and the second functional die comprises third contact features at its center and fourth contact features at its edge, wherein a height difference of the first contact features and the second contact features is greater than the height difference of the third contact features and the fourth contact features.

17. The package of claim 12, further comprising multiple dummy die surrounding the first functional die.

18. A package, comprising:
a first die having a top surface and a bottom surface opposite to the top surface, the first die further including a substrate having formed therein active devices, and a sidewall connecting the top surface and the bottom surface;
a second die adjacent to and physically separated from the first die, the second die including a top surface, a bottom surface, and a sidewall connecting the top surface of the second die to the bottom surface of the second die;
an encapsulating material surrounding the first die and the second die, the encapsulating material contacting the sidewall of the first die and contacting the sidewall of the second die, the encapsulating material further filling a space separating the sidewall of the first die and the sidewall of the second die;
a redistribution layer (RDL) structure contacting the top surface of the first die, the RDL being physically and electrically connected to electrical contacts on the top surface of the first die;
a heat dissipating feature facing the bottom surface of the first die and the bottom surface of the second die; and
a plurality of screw assemblies penetrating through the package including through the heat dissipating feature and the substrate of the first die, wherein a portion of at least one screw assembly of the plurality of screw assemblies is completely surrounded by the substrate of the first die in a top view.

19. The package of claim 18, further comprising a second screw assembly that penetrates through the encapsulating material.

20. The package of claim 18, wherein the top surface of the first die is co-planar with the top surface of the second die.

* * * * *